United States Patent [19]

Shinn, II

[11] 4,219,744
[45] Aug. 26, 1980

[54] DC-COUPLED SCHMITT TRIGGER CIRCUIT WITH INPUT IMPEDANCE PEAKING FOR INCREASING SWITCHING SPEED

[75] Inventor: Charles E. Shinn, II, Los Altos, Calif.

[73] Assignee: Hewlett-Packard Company, Palo Alto, Calif.

[21] Appl. No.: 875,041

[22] Filed: Feb. 3, 1978

[51] Int. Cl.² .......................................... H03K 3/286
[52] U.S. Cl. ................................ 307/290; 307/291; 307/317 A
[58] Field of Search ............ 307/290, 291, 292, 317 A

[56] References Cited
U.S. PATENT DOCUMENTS

| 2,840,728 | 6/1958 | Haugk et al. ................ 307/291 X |
| 3,307,047 | 2/1967 | Narud et al. ................ 307/291 |
| 3,617,776 | 11/1971 | Priel .......................... 307/291 |
| 3,849,675 | 11/1974 | Waaben ...................... 307/292 |
| 3,979,735 | 9/1976 | Payne ........................ 307/291 X |

Primary Examiner—John S. Heyman
Attorney, Agent, or Firm—David A. Boone

[57] ABSTRACT

A compact, DC-coupled Schmitt trigger circuit is disclosed for providing fast switching in response to differential current signals from an input source such as an amplifier. The circuit includes first and second matched pairs of transistors disposed for performing switching and feedback functions, respectively, and for producing a voltage at an input or base of the first pair equal to the sum (AND function) of the source voltage and the voltage at an emitter of the feedback pair. In response to the applied current signals, the transistors of the second matched pair are always in a conducting state (and requires no extra time to turn on) regardless of the conducting state of either of the transistors of the first matched pair. The circuit includes first and second matched pairs of resistors coupled to selected ones of the transistors, the resistance values of which second matched pair of resistors are selected such that the input impedance of the circuit peaks at a selected high frequency of the applied current signal.

1 Claim, 8 Drawing Figures

MOST POSITIVE SUPPLY VOLTAGE
($V_{CC}$ OR GROUND)

DC-COUPLED SCHMITT TRIGGER CIRCUIT WITH INPUT IMPEDANCE PEAKING FOR INCREASING SWITCHING SPEED

BACKGROUND OF THE INVENTION

This invention relates to bistable regenerative feedback circuits in general (e.g., bistable pulse generator circuits), and to high-speed DC-coupled ECL (emitter coupled logic) Schmitt trigger circuits in particular.

An early transistorized bistable regenerative feedback circuit is shown, for example, in FIG. 1A. Refer also, for example, to FIG. 5.21(a) in Introduction to Integrated Circuits by V. Grimich and H. Jackson, page 287, McGraw-Hill, New York, 1975. Typically in the operation of such a circuit, transistors $Q_1$ and $Q_2$ become saturated, causing undesirably slow switching.

To improve switching speed, extra circuit elements such as resistive divider elements $R_{B1}$ and $R_{B2}$ were typically added to the circuit, as shown for example in FIG. 1B. The addition of extra elements $R_{B1}$ and $R_{B2}$ substantially eliminated the saturation problem associated with $Q_1$ and $Q_2$, but caused loss in feedback signal to $Q_2$. To substantially reduce or eliminate this loss, a current source element was typically added to the circuit replacing resistor $R_{B2}$, and an emitter-follower transistor $Q_3$ was often added replacing resistor $R_{B1}$ as shown, for example, in FIG. 1C.

To further improve switching speed and to obtain common mode rejection, the single-ended configuration of the circuits, as shown in FIGS. 1A–C, was often replaced by a differential configuration as shown in FIG. 1D. In this differential configuration, the current source resistor $R_E$ of the Schmitt switching pair $Q_1$, $Q_2$ (FIG. 1C) was replaced by a true current source ($I_{E2}$), and additional resistors $R_L$ and transistors $Q_4$, $Q_5$, $Q_6$ were added to the circuit, the transistors $Q_5$, $Q_6$ being linked in a wired-OR fashion to transistors $Q_3$ and $Q_4$ as shown in FIG. 1D. Replacement of resistor $R_E$ by a true current source ensured equal output signals at both the collectors of $Q_1$ and $Q_2$, and the addition of transistors $Q_5$ and $Q_6$ in the wired-OR fashion between the input signal and the Schmitt feedback signal enabled the input signal and the regenerative feedback signal to be combined at the input or base of the Schmitt switching pair $Q_1$, $Q_2$.

To achieve faster switching without saturation and without loss in feedback signal, it is seen from the foregoing that the practice has been not only to add elements such as resistive divider and current source elements but, also, to link certain of the transistors (e.g., transistor $Q_4$ with $Q_5$, and $Q_3$ with $Q_6$) so that they perform a wired-OR function between the source or input signal ($i_{in}$ and $\bar{i}_{in}$) and the Schmitt state (i.e., the conducting state of either $Q_1$ or $Q_2$). As a consequence, signal transistors (at the input or base of the Schmitt switching pair) from a low or less positive voltage to a high or more positive voltage state occurs at a fast rate (due to low drive impedance furnished by one of the transistors in the wired-OR configuration operating in an emitter-follower manner), but signal transitions from a high to a low voltage state occurs at a significantly slower rate since the wired-OR transistors ($Q_4$–$Q_5$, $Q_3$–$Q_6$) become turned off (with no current flowing through their collectors or out of their emitters).

What is needed, therefore, is a circuit that would not only cost less to produce and be more compact than prior art circuits by requiring less rather than more elements to operate at a fast rate, but more importantly, a circuit that would combine the Schmitt state and input signal without turning off, thereby providing a switching capability that would be faster than that of prior-art trigger circuits such as the DC-coupled ECL Schmitt trigger circuit shown, for example, in FIG. 1D.

SUMMARY OF THE INVENTION

In accordance with the illustrated preferred embodiment of the present invention, a compact fast-switching DC-coupled Schmitt trigger circuit is provided having four transistors and four resistors coupled to a DC current source. The transistors include a first matched pair (differential current switching pair) and a second matched pair (positive feedback pair), and the resistors include a first matched pair (base resistors) and a second matched pair (input load resistors). The transistors are coupled to perform a wired AND function between voltage present at the output of the switching pair and voltage (measurable at the base of the switching pair) due to an applied input current flowing through the input load resistors. Each of the base resistors is coupled to a base of one of the feedback transistors and coupled to the output or collector of one of the current-switching transistors. Each of the input load resistors is coupled to an emitter of one of the feedback transistors and coupled to the base of one of the current switching transistors so as to positive feedback. The emitters of the switching pair are coupled to each other and coupled to the DC current source.

Improved frequency response (faster switching) is achieved with respect to four different factors produced by the invention. Firstly, the input impedance inherent in the circuit is made to peak at selected frequencies of the applied input signal thereby compensating for decrease in source current at selected high frequencies. This input impedance peaking factor or effect is achieved by appropriately adjusting the resistance value of the base resistors.

Secondly, the transistors of the second matched pair are always conducting, thereby requiring no extra time to turn on regardless of the conducting state of the transistors of the first matched pair.

Thirdly, the collector-to-emitter voltage across either of the transistors of the first matched pair is increased by an amount equal to the source current flowing through the emitter resistors $R_L$. This increased voltage reduces the response time of the transistors to applied signals.

Fourthly, the simplicity of the circuit implies fewer stray capacitances due to added components. Less capacitance results in faster switching time.

DESCRIPTION OF THE PREFERRED EMBODIMENT

Figure 1A:
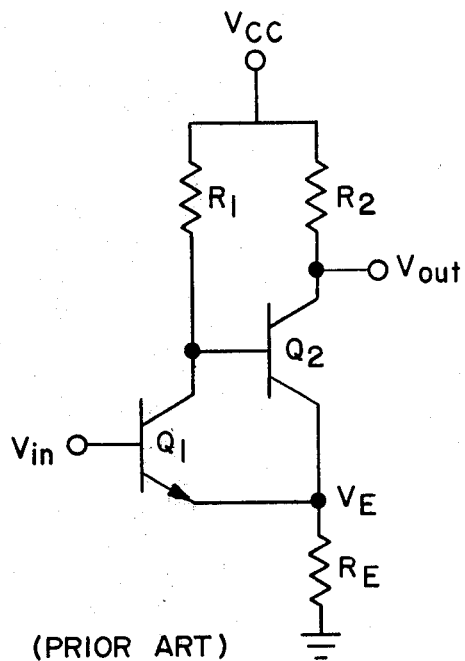
FIGS. 1A–1D are schematic diagrams showing various prior-cut circuits.
Figure 1B:
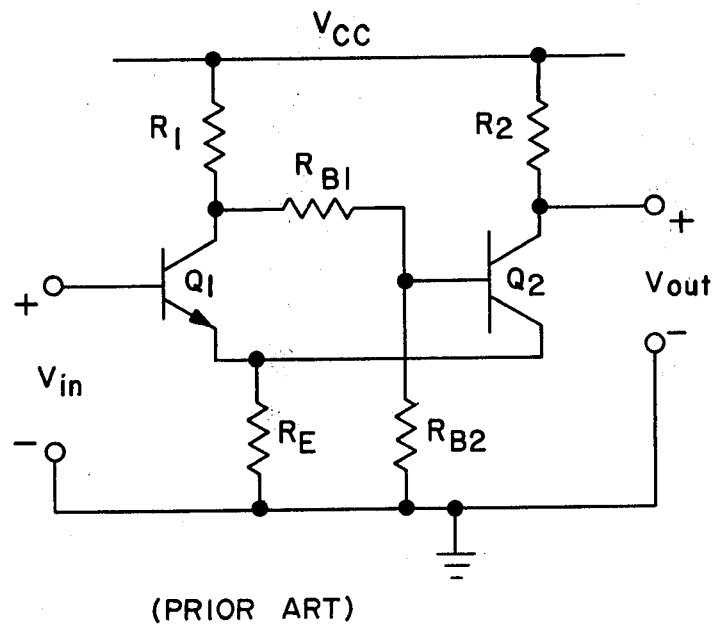
Figure 1C:
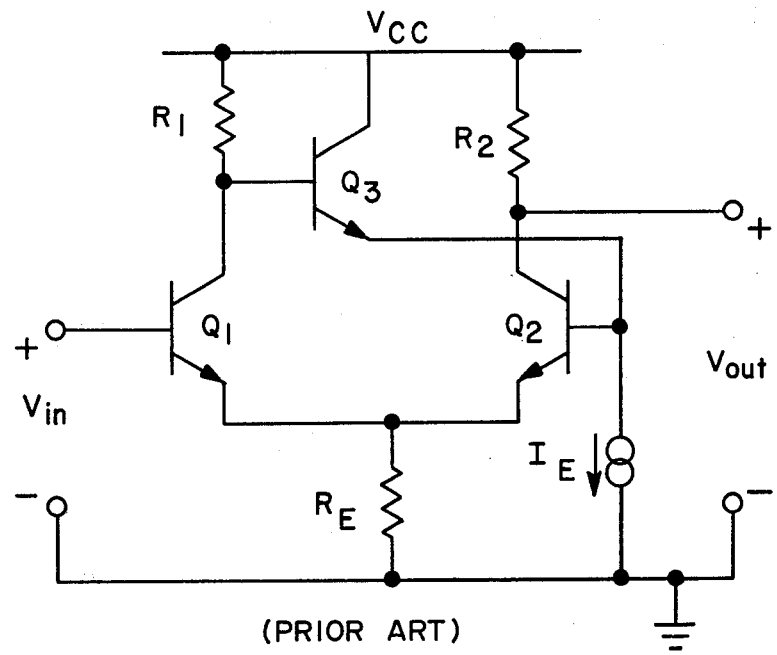
Figure 1D:
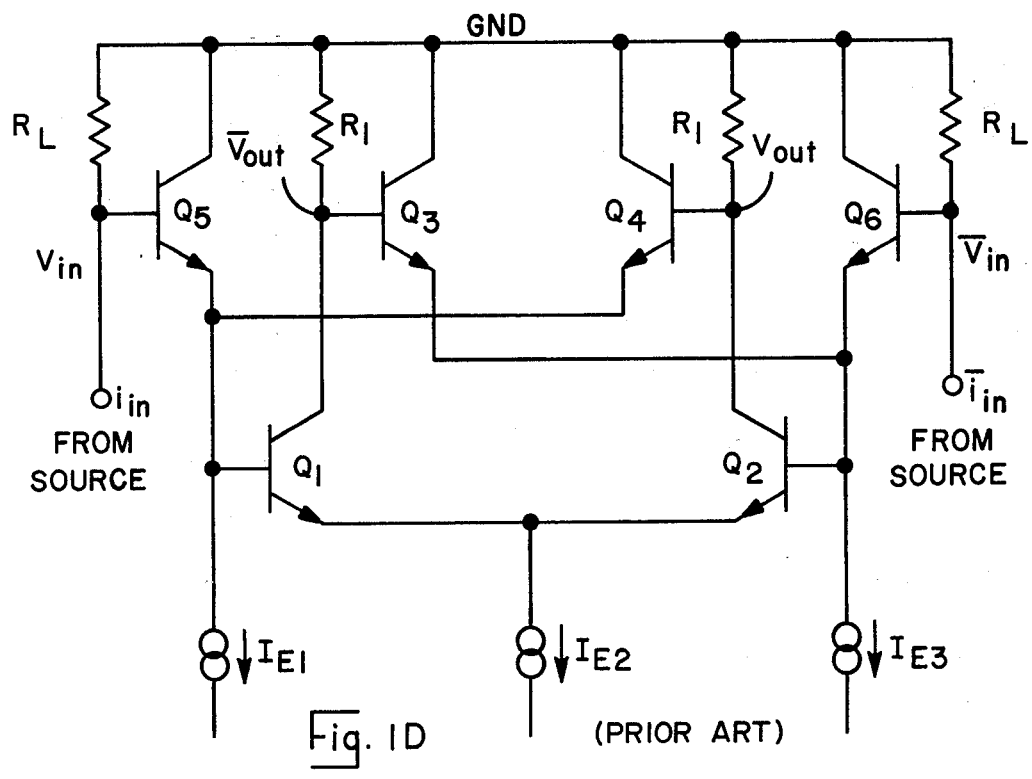
Figure 2:
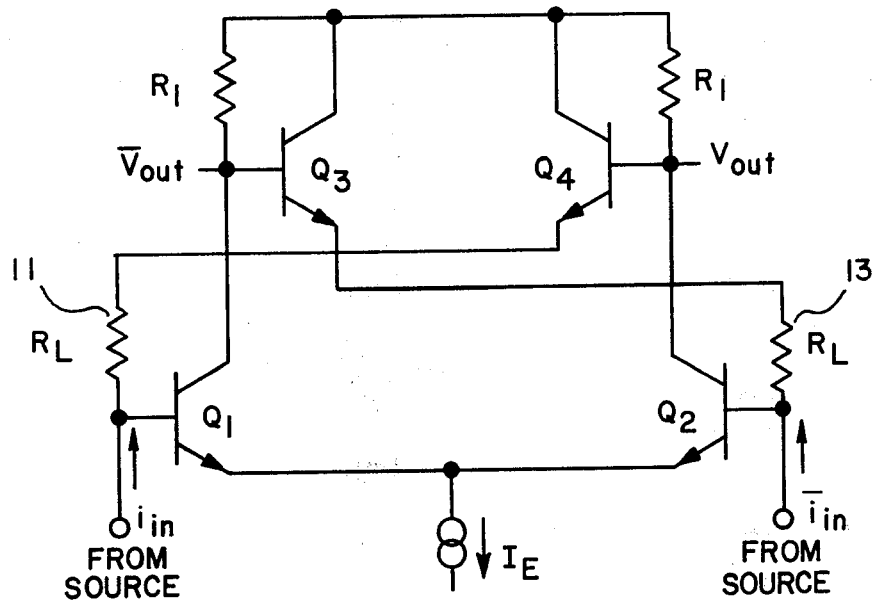
FIG. 2 is a schematic diagram of the circuit of the present invention.

Referring now to FIG. 2, there is shown a DC-coupled Schmitt trigger circuit with input impedance peaking. This circuit performs the same function as that of FIG. 1D, but requires less components, and provides a faster switching capability (improved frequency response) per unit of applied power than the circuit of FIG. 1D.

In FIG. 2, the load resistors 11, 13 are placed in series with the Schmitt feedback transistors $Q_3$ and $Q_4$, and transistors $Q_5$, $Q_6$ and DC current sources $I_{E1}$ and $I_{E3}$ (that are included in the circuit of FIG. 1D) are eliminated from the circuit. As a result, the voltage at a base or input of the Schmitt switching pair $Q_1$, $Q_2$ (FIG. 2) becomes the sum (i.e., an AND function) of the source voltage (i.e., the voltage due to source or input current $i_{in}$ or $\bar{i}_{in}$ flowing through load resistors 11, 13) and the Schmitt feedback voltage (the voltage at the emitter of $Q_3$ or $Q_4$). As a consequence of this AND function or operation, the circuit of FIG. 2 provides a faster switching capability than prior art Schmitt trigger circuits such as the circuit shown in FIG. 1D. This faster operation is attributable to four effects produced by the AND operation, viz., the effects of: (1) greater switching transistor bias voltage, (2) no extra "turn-on" time required, (3) input impedance peaking, and (4) less stray capacitance.

Generally, the greater the applied transistor bias voltage the faster the switching performed by the circuit. In the circuit of FIG. 2, $V_{CE}$, the voltage applied to transistors $Q_1$ and $Q_2$ (i.e., the DC voltage drop across or from collector to emitter of transistors $Q_1$ and $Q_2$), is increased over that applied to the circuits of FIG. 1D by an amount equal to the source DC current ($i_{in}$ and $\bar{i}_{in}$) times resistance $R_L$. This increase in bias voltage, in turn, causes an increase in the switching speed of transistors $Q_3$ and $Q_4$.

Also, unlike prior art circuits such as that of FIG. 1D which requires extra time to "turn on" source emitter followers ($Q_5$, $Q_6$) or feedback level shift transistors ($Q_3$, $Q_4$), the circuit of FIG. 2 does not require any such extra time because the feedback level shift transistors $Q_3$, $Q_4$ are always conducting, regardless of the Schmitt state, due to source signal current ($i_{in}$ and $\bar{i}_{in}$) always flowing through them ($Q_3$, $Q_4$).

Furthermore, unlike prior art circuits such as that of FIG. 1D whose input impedance ($Z_{in}$) is essentially the load impedance $R_L$ of the source (e.g., the source that provides current $i_{in}$ and $\bar{i}_{in}$), the circuit of FIG. 2 provides greater (improved) frequency response by input impedance peaking, i.e., by causing the input impedance of the Schmitt trigger circuit to increase or peak at selected high frequencies to compensate for high frequency roll-off of either the source or the Schmitt trigger circuit.

Input impedance of the Schmitt trigger circuit of FIG. 2 is calculated as follows:

$$Z_{in} = (R_L + Z_{inQ_4}) \parallel Z_{inQ_1} \text{ or } \frac{1}{\frac{1}{(R_L + Z_{inQ_4})} + \frac{1}{Z_{inQ_1}}} \quad (1)$$

The Schmitt feedback transistor $Q_4$ acts as a common base stage whose impedance is:

$$Z_{inQ_4} = r_e + \left(\frac{1}{g_m} + \frac{R_B}{\beta}\right)\left(\frac{1}{1 + \frac{1}{\beta} + \tau_t S}\right) + \frac{R_B}{\beta}\left(\frac{\beta \tau_t S}{1 + \frac{1}{\beta} + \tau_t S}\right) \quad (2)$$

where,
$r_e$ represents intrinsic emitter resistance
$g_m$ represents transconductance of the transistor
$R_B$ represents base spreading resistance ($r_{bb}$) plus any external base resistance (such as $R_1$).
$\beta$ represents current gain from base to collector
$\tau_t$ represents transistor base minority carrier transit time, and S represents jw (j being equal to $\sqrt{-1}$ and w being equal to $2\pi f$, the input frequency in radians).

In pole-zero parlance, it should be noted that the impedance $Z_{inQ_4}$ includes a zero at the frequency ($1/2\pi R_B \tau_t$)

Assuming that $Z_{inQ_1} >> (R_L + Z_{inQ_4})$ then upon substituting equation (2) in equation (1), the following mathematical simplification is obtained for input impedance $Z_{in}$:

$$Z_{in} = R_L + r_e + \frac{R_1 + r_{bb}}{\beta} + 2\pi f (R_1 + r_{bb}) \tau_t$$

From the above, it is seen that the low frequency impedance is essentially set by $R_L$ and the amount of peaking desired is set by $R_1$, where $R_1$ (as shown in FIG. 2) is part of the total base resistance $R_B$.

Figure 3:
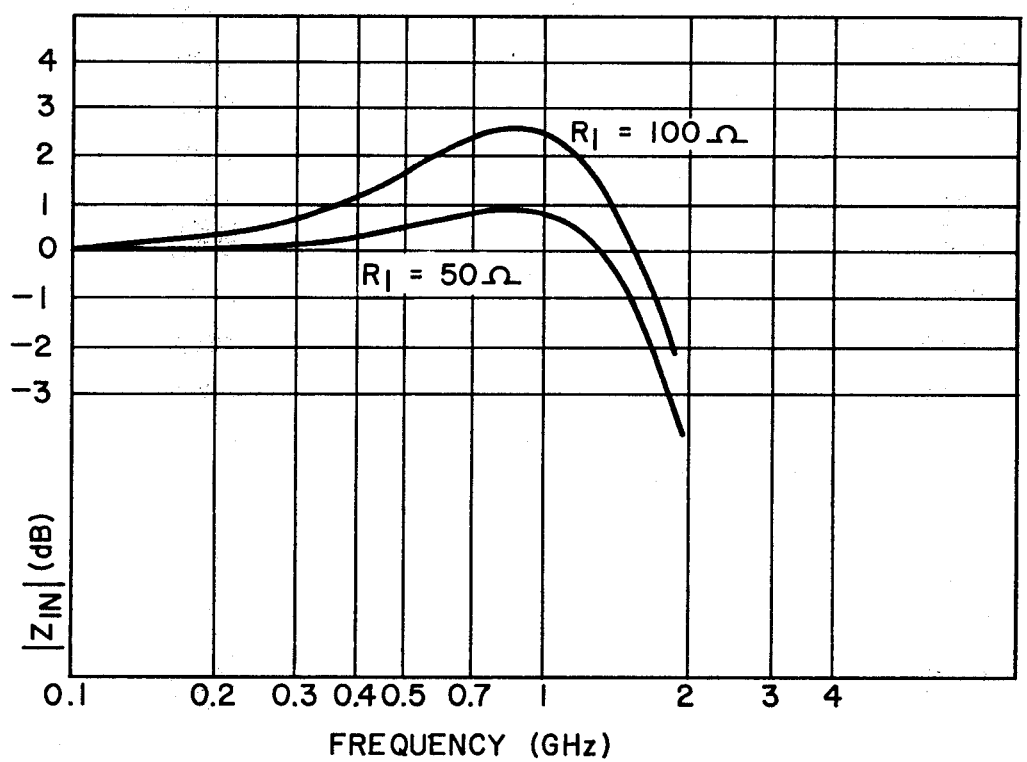
FIG. 3 is a graphic illustration of input impedance peaking of the circuit of FIG. 2 for selected resistance values and selected frequencies of current signals applied to the circuit.

FIG. 3 is a graph showing the relationship of input impedance (or the equivalent load impedance of the preceding stage) versus frequency for two values of $R_1$ (50 and 100 ohms), in the circuit of FIG. 2. For ease in evaluating this relationship, the impedance has been normalized relative to its DC value (e.g., 65 ohms) and plotted in dB. $R_1$ acts as the base resistor for transistors $Q_3$ and $Q_4$. Increasing the value of $R_1$ has the effect of increasing the peaking.

Figure 4:
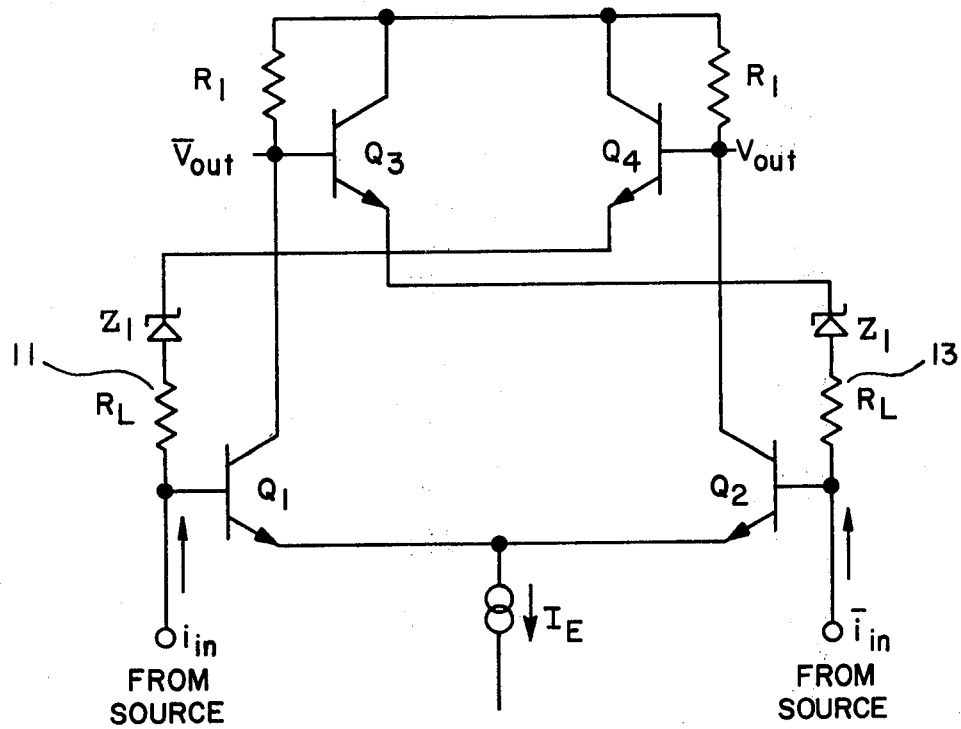
FIG. 4 is a schematic diagram of the circuit of FIG. 2 including a matched pair of zener diodes.

FIG. 4 is an alternative embodiment of the invention including a matched pair of zener diodes $Z_1$ (the diodes are matched in the sense of having similar series resistance values and similar on-voltage) each coupled in series between a base of the first matched pair of transistors $Q_1$, $Q_2$ and an emitter of the second matched pair of transistors $Q_3$, $Q_4$, to provide an increase in voltage drop between said base and said emitter. The increase, in turn, causes a further increase in the DC bias across the collector-to-emitter voltage of both of the transistors of the first matched pair.

Figure 5:
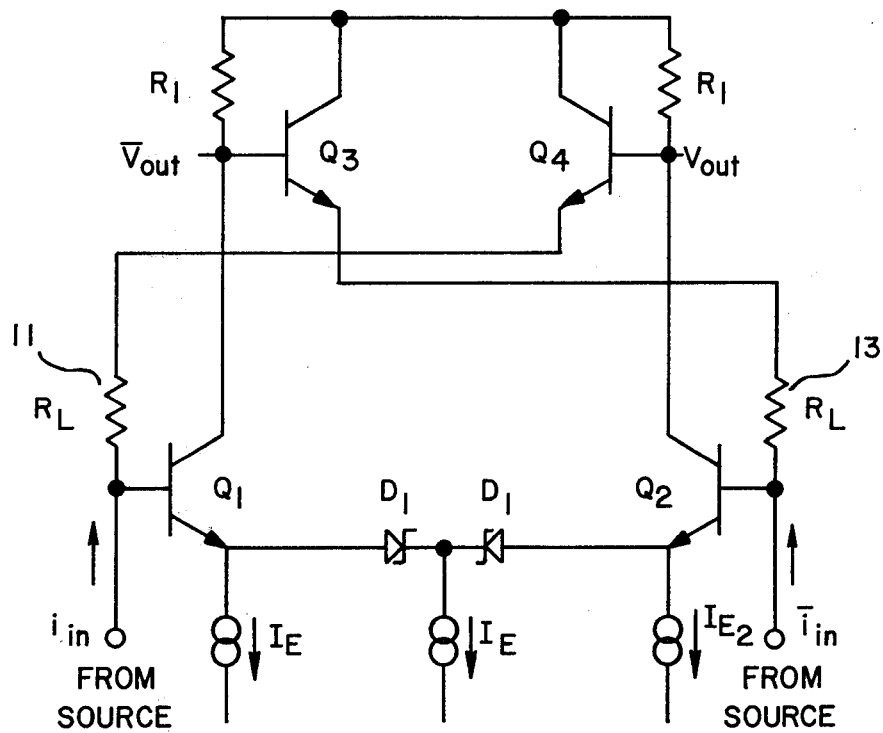
FIG. 5 is a schematic diagram of the circuit of FIG. 2 including a matched pair of Schottky diodes and a matched pair of current sources.

FIG. 5 is another embodiment of the invention, including a matched pair of Schottky diodes $D_1$ and a matched pair of current sources $I_{E2}$, wherein the diodes $D_1$ rather than the transistors $Q_1$, $Q_2$ perform the switching function.

I claim:

1. Schmitt trigger circuit responsive to differential input current signals, to a supply voltage from a voltage source and to a constant DC current from a DC current source, the circuit comprising:

a first matched differential pair of transistor means disposed for performing a switching function, each transistor having a base, an emitter, and a collector, the emitters being coupled to each other and to the DC current source, and the bases being disposed for receiving the differential input current signals;

a second matched pair of transistor means disposed for performing a feedback function and for always being in a conducting state in response to the input current signals regardless of the conducting state of the transistors of the first matched pair, each transistor having a base, an emitter, and a collector, the collectors of said second pair being coupled to each other and to the voltage supply, the base of one transistor of said second pair being coupled to the collector of one transistor of said first pair such that positive feedback occurs, and the base of the other transistor of said second pair being coupled to the collector of the other transistor of said first pair;

a first matched pair of resistors, one being coupled between the base of the one transistor of said first pair and the emitter of the other transistor of said second pair, and the other resistor being coupled between the base of the other transistor of said first pair and the emitter of the one transistor of said second pair;

a second matched pair of resistors, one end of each resistor being coupled to the voltage supply and each of the other ends being coupled to a different one of the bases of the second matched pair of transistors, the resistors of said second matched pair each having a resistance value selected so that input impedance of the circuit peaks at a selected high frequency of the applied current signal; and a matched pair of Schottky diodes and a matched pair of current sources, each of the Schottky diodes and each of the pair of current souces being coupled to an emitter of the first matched pair of transistors, the Schotty diodes being further coupled to each other and to the DC current source.

* * * * *

UNITED STATES PATENT AND TRADEMARK OFFICE
CERTIFICATE OF CORRECTION

PATENT NO. : 4,219,744
DATED : August 26, 1980
INVENTOR(S) : Charles E. Shinn, II It is certified that error appears in the above-identified patent and that said Letters Patent are hereby corrected as shown below:

Column 1, line 56 delete "transistors" and insert "transitions--

Signed and Sealed this

Eighth Day of September 1981

[SEAL]

Attest:

GERALD J. MOSSINGHOFF

Attesting Officer

Commissioner of Patents and Trademarks